United States Patent [19]

Sasaki et al.

[11] Patent Number: 5,374,343
[45] Date of Patent: Dec. 20, 1994

[54] MAGNETRON CATHODE ASSEMBLY

[75] Inventors: Toru Sasaki; Nobuyuki Takahashi, both of Tokyo, Japan

[73] Assignee: Anelva Corporation, Tokyo, Japan

[21] Appl. No.: 50,573

[22] Filed: Apr. 21, 1993

[30] Foreign Application Priority Data

May 15, 1992 [JP] Japan .................................. 4-123879

[51] Int. Cl.⁵ .............................................. C23C 14/35
[52] U.S. Cl. ............................. 204/298.2; 204/192.12
[58] Field of Search ................ 204/298.2, 192.12

[56] References Cited

U.S. PATENT DOCUMENTS

| | | | |
|---|---|---|---|
| 3,282,816 | 11/1966 | Kay | 204/192.12 |
| 4,392,939 | 7/1983 | Crombeen et al. | 204/298.19 |
| 4,407,713 | 10/1983 | Zega | 204/298.22 |
| 4,437,966 | 3/1984 | Hope et al. | 204/298.29 |
| 4,444,643 | 4/1984 | Garrett | 204/298.2 |
| 4,461,688 | 7/1984 | Morrison, Jr. | 204/192.12 |
| 4,498,969 | 2/1985 | Ramachandran | 204/192.12 |
| 4,525,264 | 6/1985 | Hoffman | 204/298.2 |
| 4,631,106 | 12/1986 | Nakazato et al. | 156/345 |
| 4,714,536 | 12/1987 | Freeman et al. | 204/298.2 |
| 4,746,417 | 5/1988 | Ferenbach et al. | 204/298.2 |
| 4,826,584 | 5/1989 | dos Santos Pereiro Ribeiro | 204/298.09 |
| 4,842,703 | 6/1989 | Class et al. | 204/192.12 |
| 4,872,964 | 10/1989 | Suzuki et al. | 204/298.2 |
| 5,047,130 | 9/1991 | Akao et al. | 204/192.12 |
| 5,164,063 | 11/1992 | Braeuer et al. | 204/298.2 |
| 5,182,003 | 1/1993 | Maass et al. | 204/298.23 |
| 5,194,131 | 3/1993 | Anderson | 204/192.12 |
| 5,242,566 | 9/1993 | Parker | 204/298.2 |
| 5,248,402 | 9/1993 | Ballentine et al. | 204/298.2 |
| 5,252,194 | 10/1993 | Demaray et al. | 204/298.2 |

FOREIGN PATENT DOCUMENTS

| | | | |
|---|---|---|---|
| 0451642 | 10/1991 | European Pat. Off. | 204/298.2 |
| 0525295 | 3/1992 | European Pat. Off. | 204/298.2 |
| 2707144 | 8/1977 | Germany | 204/298.2 |
| 53-7586 | 1/1978 | Japan | 204/298.2 |
| 60-224775 | 11/1985 | Japan | 204/298.2 |
| 61-4177 | 2/1986 | Japan | 204/298.19 |
| 61-52360 | 3/1986 | Japan | 204/298.12 |
| 61-291971 | 12/1986 | Japan | 204/298.2 |
| 62-89864 | 4/1987 | Japan | 204/298.2 |
| 62-211375 | 9/1987 | Japan | 204/298.2 |
| 63-48632 | 3/1988 | Japan | 204/192.12 |
| 63-53261 | 3/1988 | Japan | 204/298.2 |
| 63-57765 | 3/1988 | Japan | 204/298.28 |
| 63-149374 | 6/1988 | Japan | 204/298.2 |
| 63-277758 | 11/1988 | Japan | 204/298.2 |
| 63-290275 | 11/1988 | Japan | 204/298.2 |
| 63-293162 | 11/1988 | Japan | 204/298.2 |
| 63-307270 | 12/1988 | Japan | 204/298.19 |
| 63-317671 | 12/1988 | Japan | 204/298.19 |
| 64-13123 | 1/1989 | Japan | 204/298.19 |
| 1-268867 | 10/1989 | Japan | 204/298.2 |
| 2-34780 | 2/1990 | Japan | 204/298.2 |
| 2-99962 | 8/1990 | Japan | 204/298.2 |
| 2-225664 | 9/1990 | Japan | 204/298.2 |
| 2-246216 | 10/1990 | Japan | 204/298.2 |
| 3-53065 | 3/1991 | Japan | 204/298.16 |

*Primary Examiner*—Aaron Weisstuch
*Attorney, Agent, or Firm*—Sughrue, Mion, Zinn, Macpeak & Seas

[57] ABSTRACT

A magnetron sputtering apparatus is provided that is equipped with a magnetron cathode assembly in which the target can be sufficiently sputtered in the central portion to insure that it will not be a cause of particulate contamination and which permits the use of a target of larger diameter without compromising the ability to assure a satisfactorily high film deposition rate. The magnetron cathode assembly comprises basically a flat circular target, a magnetic field applying means provided near the back side of the target, and a rotary driving means for rotating the position of a magnetic field on the surface of the target, and the magnetic field application means includes at least one arrangement in which different spaced magnetic poles are provided to face each other in such a manner that they surround the central portion of the target.

14 Claims, 9 Drawing Sheets

FIG. 12 PRIOR ART

MAGNETRON CATHODE ASSEMBLY

BACKGROUND OF THE INVENTION

1. Field of the Invention

The present invention relates to an improved arrangement of magnets in the cathode assembly of a magnetron sputtering apparatus.

2. Description of the Prior Art

With a magnetron sputtering apparatus for sputtering processing by stationary magnets, the surface of the target is eroded locally intensely; therefore, the utilization efficiency is low. To erode uniformly across the target, it has been proposed that the magnets be designed to be movable during sputtering as described in Japanese Patent Laid-Open Publication (Kokai) Sho 53-7586 (1978). One of the modifications so far developed for moving the magnets is to rotate them.

Figure 4A:
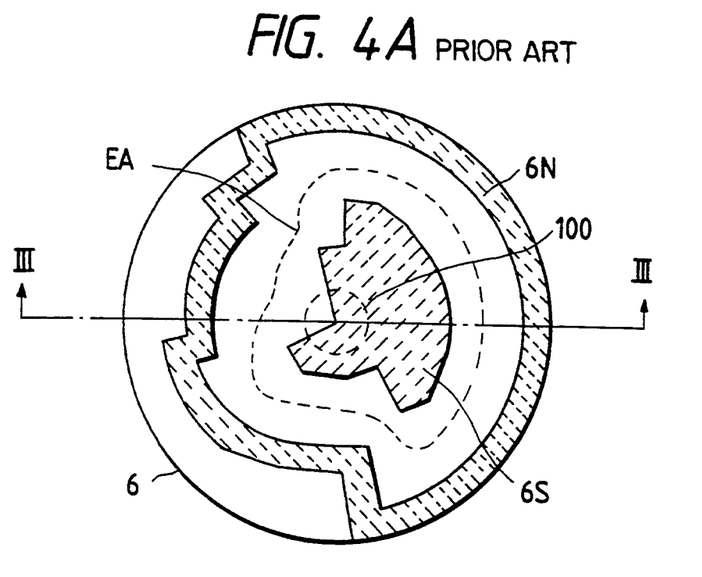
FIG. 4A shows the magnet arrangement in the back side of an electrode in a conventional magnetron sputtering apparatus.
Figure 4B:
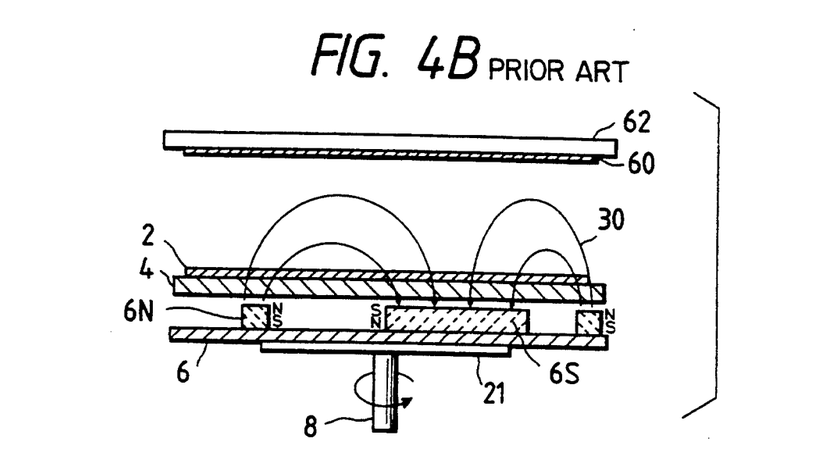
FIG. 4B is a front sectional view as taken on line III—III in FIG. 4A.
Figure 4C:
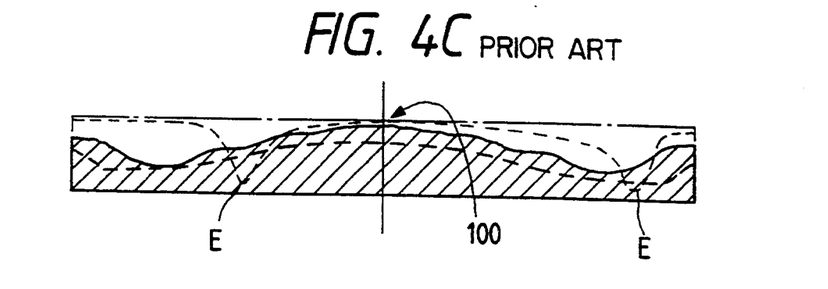
FIG. 4C is a sectional view showing the depth profile erosion area in the surface of a target when it was sputtered with the magnets being rotated.

FIGS. 4A–4C show a magnetron sputtering apparatus described in U.S. Pat. No. 5,047,130 in which the magnets are rotated. FIG. 4A is a plan view of the cathode electrode assembly of the magnetron sputtering apparatus, in which permanent magnets 6N and 6S have north (N) and south (S) surface poles, respectively, are arranged as shown. FIG. 4B is a sectional view as taken on line III—III in FIG. 4A. The cathode assembly provided within the vacuum chamber (not shown) of the magnetron sputtering apparatus comprises a target 2, a cathode 4 to place the target thereon, a yoke 6 facing the back side of the cathode 4, on which permanent magnets 6N and 6S are mounted, a yoke holder 21 and a rotary shaft 8. When the shaft 8 rotates, the permanent magnets 6N and 6S turn with the yoke 6 and the yoke holder 21 being rotated. The magnetic lines of force 30 produced by the magnets 6N and 6S pass through the target 2 and form loops that are closed above the target. As shown in FIG. 4B, a substrate 60 mounted on a substrate holding electrode 62 (by mounting means not shown) is provided above the target.

When argon (At) gas is supplied into the vacuum chamber and a DC voltage applied between the cathode electrode 4 and the substrate holding electrode 62 from a power supply unit (not shown), electrons are produced that revolve spirally around the magnetic lines of force 30. As a result, a magnetron discharge is generated. By the generated magnetron discharge, the surface of the target 2 is sputtered, allowing a thin film of the target material to be deposited on the surface of the substrate 60.

As one can also see from FIG. 4A, the magnet 6S is provided in the back side of the central portion 100 of the target 2 and has a south (S) surface pole. The magnet 6N is located around a looped region EA surrounding the magnet 6S and has a north (N) surface pole. If sputtering is performed without rotating the yoke 6 (i.e., the magnets are held stationary), the surface of the target 2 will be eroded in a region of a shape that is substantially identical to the looped region EA.

Figure 12:
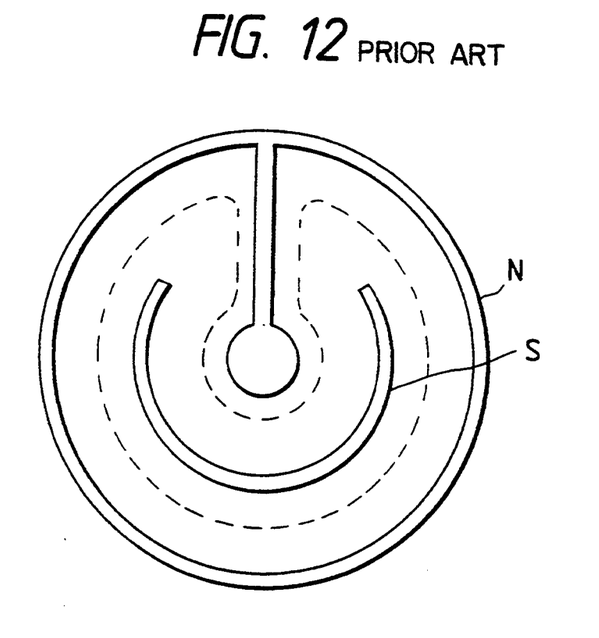
FIG. 12 shows a magnet arrangement of the yoke in the conventional magnetron sputtering apparatus.

FIG. 4C is a sectional view as taken on line III—III in FIG. 4A to show the depth profile of a target 2 that was eroded by sputtering while the yoke 6 is rotated (the dimension of the target in the direction of thickness is exaggerated in FIG. 4C). As can be seen from FIG. 4C, the target 2 was only barely sputtered in the central portion 100. The fine dashed line in FIG. 4C delineates the depth profile of a target 2 that was eroded by sputtering while the yoke 6 is held stationary. The most deeply eroded area E occurs depicting a loop that is delineated by a closed curve EA (as indicated by the dashed line in FIG. 4A) on the surface of the target. If the yoke 6 is stationary, a non-eroded area will occur on the surface of the target. The erosion area of the target 2 is expanded by rotating the yoke 6. Japanese Utility Model Laid-Open Publication (Kokai) Hei 2-99962 is similar to the cathode assembly of U.S. Pat. No. 5,047,130 in that the eroded area is expanded by rotating the yoke. Furthermore, U.S. Pat. No. 5,182,003 discloses a yoke having a magnet arrangement as shown in FIG. 12, but the yoke does not itself rotate. In this arrangement, even if the yoke is rotated, a noneroded area will occur on the surface of the target.

With the conventional cathode assembly described above, the target 2 is barely sputtered in the central portion 100. If some part of the target remains unsputtered, the sputtered particles will be deposited on that unsputtered area to form a thin film. If the deposited film grows to a thickness that develops internal stress, the film will shed off or crack, causing particulate contamination.

Figures 6A, 6B:
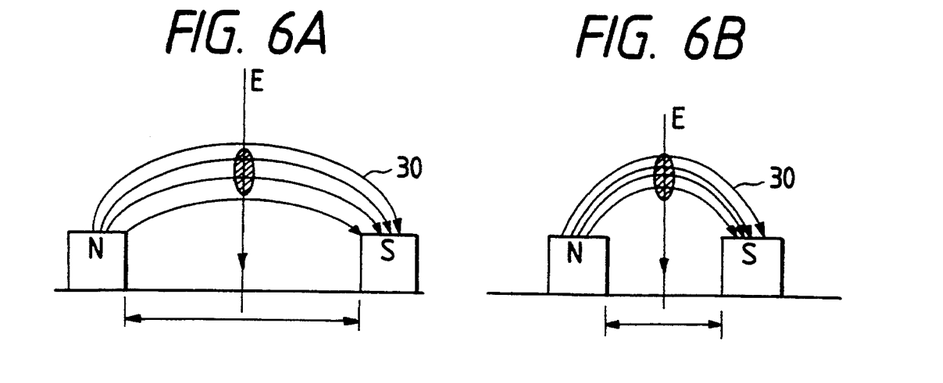
FIGS. 6A and 6B illustrate variations in the number of magnetic lines of force passing per unit area in response to the change in the distance between two magnets.
Figure 7:
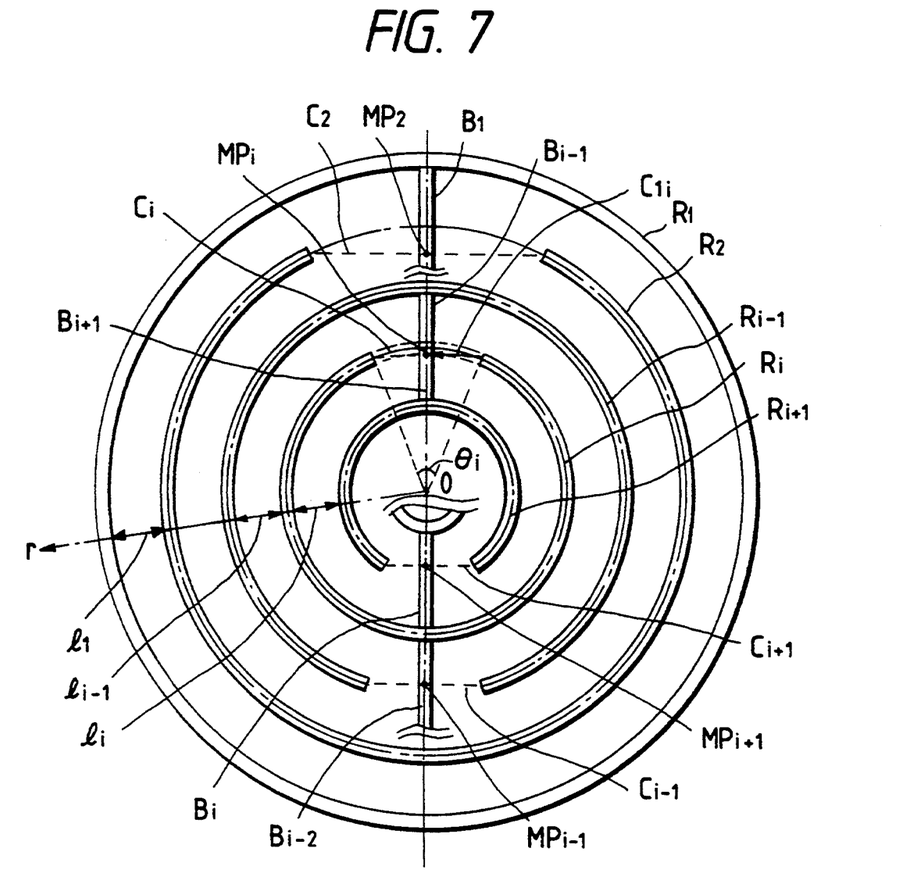
FIG. 7 shows another preferred embodiment of the general arrangement of magnets of the present invention.

The recent tendency in the field of semiconductor fabrication is to use a silicon (Si) substrate of larger diameter for VLSIs and the heretofore common 6-inch substrates are increasingly being replaced by 8-inch or even 10-inch substrates. This has accordingly created the need to increase the diameter of the target. One of the problems with the conventional arrangement of magnets shown in FIG. 4A is that as the distance between magnets 6N and 6S increases, the plasma density will decrease, making it difficult to produce a thin film at high speed. This is because given the coercive force of two magnets with N and S poles, the flux density of magnetic lines of force 30 passing per unit area (the elliptic hatched areas in FIGS. 6A and 6B) between the two magnets will decrease as the distance between the two magnets increases. Magnetron discharge is usually created by applying an electric field (electric lines of force) E crossing a magnetic field (magnetic lines of force) at a right angle. Given the intensity of the applied electric field (electric lines of force), the density of plasma generated by the magnetron discharge is proportional to the flux density of magnetic lines of force 30 passing per a unit area (the elliptic hatched areas in FIGS. 6A and 6B) parallel to the applied electric field (electric lines of force). Therefore, given the coercive force of the magnets producing the magnetic field (magnetic lines of force) and also given the intensity of the electric field (electric lines of force) crossing the magnetic field (magnetic lines of force) at a right angle, the plasma density of the magnetron discharge will be in inverse proportion to the distance between the two magnets. In other words, the plasma density of the magnetron discharge will decrease with the increasing distance between the magnets.

SUMMARY OF THE INVENTION

The present invention has been accomplished under these circumstances. An object, therefore, of the present invention is to provide a magnetron sputtering apparatus that enables the target to be sufficiently sputtered in the central portion so that this central portion will not be a cause of particulate contamination.

Another object of the present invention is to provide a magnetron sputtering apparatus that permits the use of a target of larger diameter and which yet is capable of reducing the distance between magnets sufficiently to produce satisfactorily dense magnetic lines of force 30.

These objects of the present invention can be attained by a magnetron cathode assembly that comprises a flat circular target, a magnetic field applying means provided near the back side of the target and a rotary driving means for rotating the magnetic field applying means with respect to a central portion of the circular target, in which the magnetic field applying means has a plurality of first annular magnets having a first polarity and a plurality of a second annular magnets; the radii of the first and second annular magnets being sequentially varied, each of the first and second annular magnets, except for the outermost circumferential annular magnet missing an arc segment; the first and second annular magnets being alternately arranged concentrically with the center of the circular target, in which neighboring annular magnets which have the same polarity are connected to each other through the missing arc segment of the annular magnet having a reverse polarity by a bar-shaped magnet which has the same polarity as the annular magnets; and extending from an inner circumference, said bar-shaped magnet is inserted within the missing arc segment of the innermost annular magnet.

Furthermore, a magnetron cathode assembly comprises basically a flat circular target, a magnetic field applying means provided near the back side of the target and a rotary driving means for rotating the magnetic field applying means, which is characterized in that the magnetic field applying means has a plurality of magnets, one of which is a loop-shaped magnet, the plurality of magnets being arranged in such a way as to satisfy the following conditions:

(1) they are disposed alternately in a way that surrounds the central point of the target;

(2) the loop-shaped magnet is located in the outermost position;

(3) any two neighboring magnets that do not contact each other have opposite polarities whereas any two magnets that contact each other have the same polarity;

(4) regions containing the magnetic lines of force that are created by neighboring magnets that do not contact each other are arranged in such a way as to define a single closed curve; and (5) magnetic lines of force are created above the central point of the target.

To state a more specific arrangement of magnets that can advantageously attain the aforementioned objects of the present invention, the magnetic field applying means should have n ring-shaped magnets $R_1, R_2, R_3, \ldots, R_{i-1}, R_i, R_{i+1}, \ldots, R_{n-1}$ and $R_n$, and $(n-1)$ bar-shaped magnets $B_1, B_2, B_3, \ldots, B_{i-1}, B_i, B_{i+1}, \ldots$ and $B_{n-1}$, being further characterized in that:

(1) the ring-shaped magnets satisfy the following conditions:

(i) the outer circumference of the ring-shaped magnet $R_i$ is smaller than the inner circumference of the ring-shaped magnet $R_{i-1}$;

(ii) ring-shaped magnets $R_2, R_3, \ldots, R_{i-1}, R_i, R_{i+1}, \ldots, R_{n-1}$ and $R_n$ each have a missing arc segment;

(iii) the central angle $\theta_1$ subtended by the missing arc segment of the central circumference of the ring-shaped magnet $R_i$ is smaller than 180° and the chord $IC_i$ of the missing arc segment of the inner circumference of the ring-shaped magnet $R_i$ is greater than the width on the shorter side of the bar-shaped magnet $B_{i-1}$;

(2) the arrangement of the ring-shaped magnets satisfies the following conditions:

(i) ring-shaped magnets $R_2, R_3, \ldots, R_{i-1}, R_i, R_{i+1}, \ldots, R_{n-1}$ and $R_n$ are arranged concentrically with the central point O of the ring-shaped magnet $R_1$, which is located to coincide with central point of the rotary driving means for rotating those ring-shaped magnets;

(ii) ring-shaped magnets $R_3, \ldots, R_{1-1}, R_i, R_{i+1}, \ldots, R_{n-1}$ and $R_n$ have such a positional relationship that the midpoints $MP_3, \ldots, MP_{i-1}, MP_i, MP_{i+1}, \ldots, MP_{n-1}$ and $MP_n$ of the chords $C_3, \ldots, C_{i-1}, C_i, C_{i+1}, \ldots, C_{n-1}$ and $C_n$, respectively, of the missing arc segments of the respective central circumferences are located on the line connecting the central point O and the midpoint $MP_2$ of the chord $C_2$ of the missing arc segment of the central circumference of the ring-shaped magnet $R_2$, wherein:

(3) the positional relationship between the ring-shaped magnets and the bar-shaped magnets satisfy the following conditions:

(i) Bar-shaped magnet $B_{i-1}$ contacts the ring-shaped magnets $R_{i-1}$ and $R_{i+1}$ on each shorter side of the bar-shaped magnet $B_{i-1}$;

(ii) any one of the midpoints of the width on the shorter side of the bar-shaped magnet $B_{i-1}$ is located on the midpoint $MP_i$ of the chord $C_i$ of the missing arc segment of the central circumference of the ring-shaped magnet $R_i$; and (iii) one shorter side of the bar-shaped magnet $B_{n-1}$ contacts the right-shaped magnet $R_{n-1}$ and each of the midpoints of the width on the shorter side of the bar-shaped magnet $B_{i-1}$ is located on the midpoint $MP_i$ of the chord $C_i$ of the missing arc segment of the central circumference of the ring-shaped magnet $R_i$ and the distance between the central point O and the other shorter side of the bar-shaped magnet $B_{n-1}$ is smaller than the radius of the inner circumference of the ring-shaped magnet $R_{n-1}$; and (4) ring-shaped magnets $R_{i-1}$ and $R_{i+1}$ have surface poles of the same polarity as the surface pole of the bar-shaped magnet $B_{i-1}$ whereas the surface poles of the ring-shaped magnet $R_i$ and the bar-shaped magnet $B_i$ are opposite in polarity.

In the magnetic field applying means, the magnets are arranged alternately in such a way that different poles surround the central portion of the target whereas magnetic lines of force will be created above the central point of the target; hence, the target will be eroded in the central portion even if it is sputtered with the magnets being held stationary. Furthermore, if the target is sputtered with the above-described arrangement of magnets being rotated, an eroded area can be produced over the entire surface of the target.

Arranging the magnets alternately in such a manner that different poles surround the central portion of the target offers another advantage in that even if the diameter of the target is increased significantly, the distance between magnets with different poles can be sufficiently reduced to produce high magnetic flux density on the surface of the target.

DETAILED DESCRIPTION OF THE PREFERRED EMBODIMENTS OF THE INVENTION

The preferred embodiments of the present invention are described below with reference to the accompanying drawings. It should be noted that the figures associated with the embodiments show the geometries, sizes, and relative positions of the respective components only diagrammatically to such an extent that one skilled in the art can understand the present invention.

The principal feature of the present invention lies in the arrangement of magnets on the yoke as follows.

(1) The magnets, one of which is a loop-shaped magnet, alternate in a way such that they surround the center of the target;

(2) The loop-shaped magnet is located in the outermost position;

(3) Neighboring magnets that do not contact each other have two opposite polarities whereas magnets that contact each other have the same polarity;

(4) Regions where the magnetic lines of force created by any two neighboring magnets that do not contact each other are arranged in such a way as to define a single closed curve; and (5) Magnetic lines of force are created above the center of the target.

The arrangement of magnets in accordance with the present invention is described below more specifically with reference to FIGS. 7 to 11.

(1) n ring-shaped magnets $R_1, R_2, R_3, \ldots, R_{i-1}, R_i, R_{i+1}, \ldots R_{n-1}$ and $R_n$, as well as (n−1) bar-shaped magnets $B_1, B_2, B_3, \ldots, B_{n-1}, B_i B_{i+1}, \ldots,$ and $B_{n-1}$ are provided. According to the present invention, the n ring-shaped magnets are adapted to satisfy the following three conditions:

(i) The outer circumference of the ring-shaped magnet $R_i$ should be smaller than the inner circumference of the ring-shaped magnet $R_{i-1}$. Hence, the ring-shaped magnet $R_1$ is the largest and the ring-shaped magnet $R_n$ is the smallest.

(ii) Ring-shaped magnets $R_2, R_3, \ldots, R_{i-1}, R_i, R_{i+1}, \ldots, R_{n-1}$ and $R_n$ each have an arc segment missing, except for the ring-shaped magnet $R_1$ which forms a complete ring.

Figure 1A:
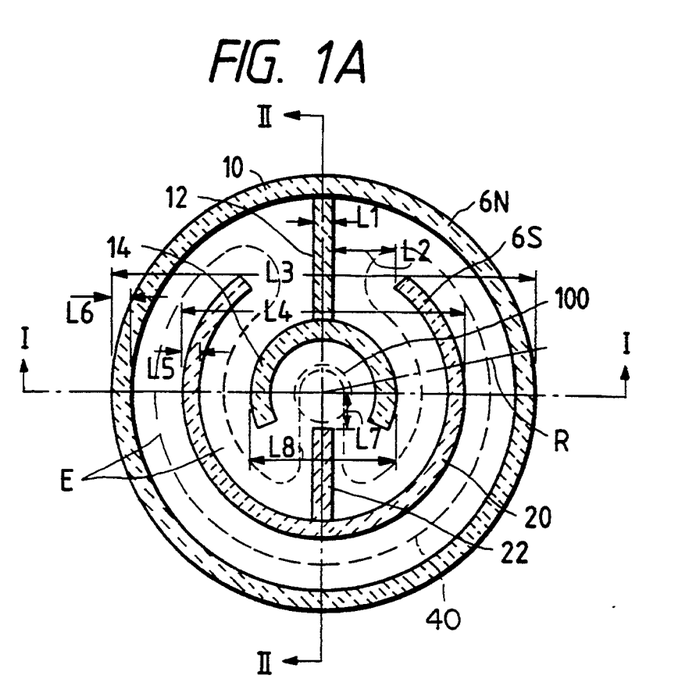
FIG. 1A is a plan view showing how magnets are arranged on the back side of an electrode in a preferred embodiment of the present invention.
Figure 3:
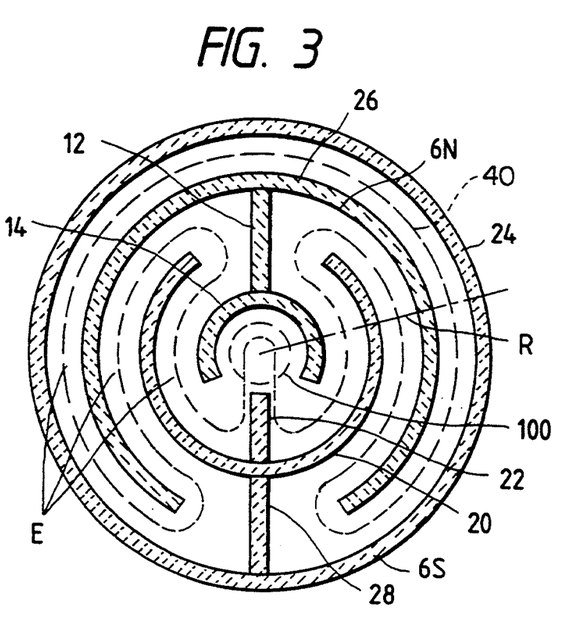
FIG. 3 shows the magnet arrangement in the back side of an electrode in another preferred embodiment of the present invention.
Figure 5A:
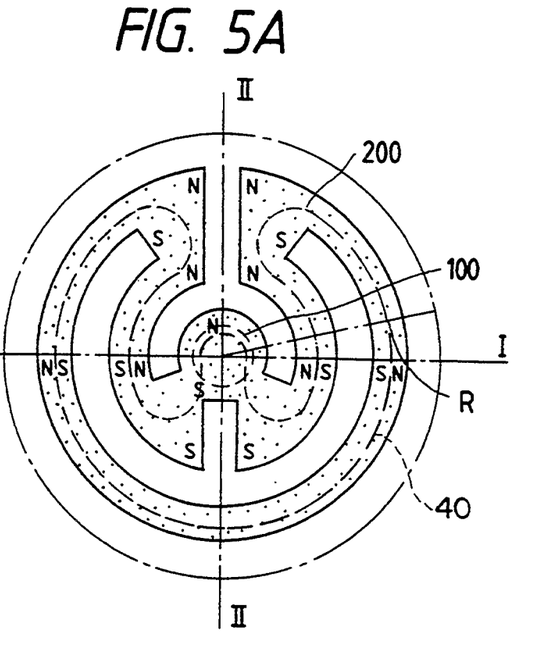
FIG. 5A shows the magnet arrangement in the back side of an electrode in yet another preferred embodiment of the present invention.
Figure 9A:
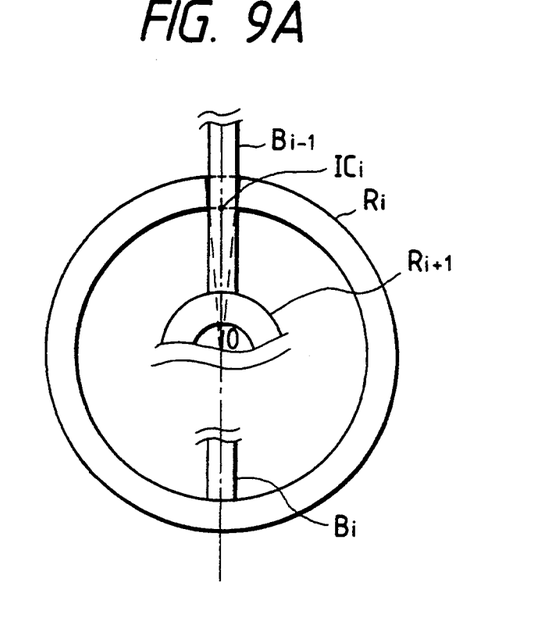
FIG. 9A shows contacting of a ring-shaped magnet with a bar-shaped magnet.
Figure 9B:
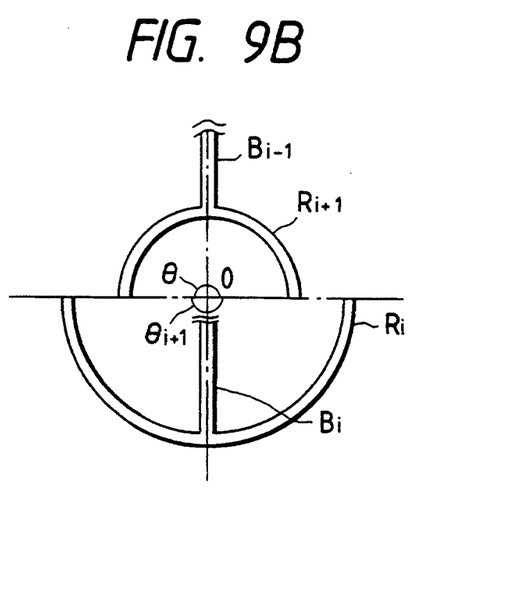
FIG. 9B shows the arrangement of magnets in the case where the central angle subtended by the missing arc segment of each ring-shaped magnet is 180°.

(iii) The central angle $\theta_i$ subtended by the missing arc segment of the central circumference of the ring-shaped magnet $R_i$ is smaller than 180° and the chord $C_i$ of the missing arc segment of the inner circumference of the ring-shaped magnet $R_i$ is greater than the width on the shorter side of the bar-shaped magnet $B_{i-1}$. If the central angle $\theta_i$ of the missing arc segment of a neighboring ring-shaped magnet is greater than 180°, the overlap of two ring-shaped magnets as seen from the central point O is smaller than when the central angle $\theta_i$ of the missing arc segment of the same neighboring ring-shaped magnet is smaller than 180°. As a result, magnetron discharge will be generated in only a limited area on the target. Furthermore, if the central angle $\theta_i$ of each missing arc segment is greater than 180°, there is no overlap at all between ring-shaped magnets, say, the ring-shaped magnets $R_i$ and $R_{i+1}$, as shown in FIG. 9B. Even if there is no overlap at all, a magnetron discharge will be generated but the plasma density is low, i.e., not enough to keep the magnetron discharge stable. If the chord $C_i$ of the missing arc segment of the inner circumference of the ring-shaped magnets $R_i$ is equal to the width on the shorter side of the bar-shaped magnet $B_{i-1}$, the ring-shaped magnet $R_i$ will contact the bar-shaped magnet $B_{i-1}$ as shown in FIG. 9A. In this case, regions where the magnetic lines of force exist, created by any two neighboring magnets that do contact each other, cannot be arranged in such a way as to draw a single closed curve. The term "regions where the magnetic lines of force exist" means those regions where a magnetron discharge is generated. In magnetron sputtering, an electric field (electric lines of force) is usually applied in a direction perpendicular to the surface of a target, thereby generating a magnetron discharge on the target surface. Hence, regions where the magnetic lines of force exist, created by any two neighboring magnets that do not contact each other, may well be described as regions where a magnetron discharge is to be generated. Furthermore, in order to insure that the generated magnetron discharge is maintained in the most stable manner and that the highest plasma density is produced, the regions where the magnetron discharge is to be generated must be arranged in such a way as to draw a single closed curve. To meet these requirements, the magnets must be arranged in such a way that the regions where magnetic lines of force are created by those magnets will draw a single closed curve, for example, as shown in FIGS. 1A, 3, and 5A, in which the single closed curve is indicated by 40.

(2) The arrangement of the ring-shaped magnets should satisfy the following conditions:

(i) The ring-shaped magnets $R_2, R_3, \ldots, R_{i-1}, R_i, R_{i+1}, \ldots, R_{n-1}$ and $R_n$ are arranged concentrically with the central point O of the ring-shaped magnet $R_1$, which is located to coincide with the central point of the rotary driving means for driving those ring-shaped magnets. The concentric arrangement of those ring-shaped magnets insures that the distance between any two neighboring magnets that do not contact each other along the radial direction r of the ring-shaped magnet $R_i$, say, distance $l_i$ between the ring-shaped magnets $R_i$ and $R_{i+1}$ is the same in all areas where the ring-shaped magnet $R_i$ overlaps the ring-shaped magnet $R_{i+1}$. As will be discussed hereinafter, one may arbitrarily adjust the width of $l_i$, or the distance between the ring-shaped magnets $R_i$ and $R_{i+1}$ and, by so doing, various depth profiles of erosion can be easily produced across the surface of a target as shown in FIG. 10.

(ii) The ring-shaped magnets $R_3, \ldots, R_{i-1}, R_i, R_{i+1}, \ldots, R_{n-1}$ and $R_n$ have such a positional relationship that the midpoints $MP_3, \ldots, MP_{i-1}, MP_i, MP_{i+1}, \ldots, MP_{n-1}$ and $MP_n$ of the chords $C_3, \ldots, C_{i-1}, C_i, C_{i+1}, \ldots, C_{n-1}$ and $C_n$, respectively, of the missing arc segments of the respective central circumferences are located on the line passing through the central point O and the midpoint $MP_2$ of the chord $C_2$ of the missing arc segment of the central circumference of the ring-shaped magnet $R_2$. This arrangement enables various depth profiles of erosion to be easily produced across the surface of a target. In a particular case where $Cl_i$, or the distance between the ring-shaped magnet $R_i$ and the bar-shaped magnet $B_{i-1}$, is equal to $l_i$, or the distance between the ring-shaped magnets $R_i$ and $R_{i+1}$, the depth profiles of erosion shown in FIGS. 10A, 10B, and 10C can be easily produced.

(3) The positional relationship of the ring-shaped magnets and the bar-shaped magnets should satisfy the following conditions.

(i) The bar-shaped magnet $B_{i+1}$ contacts the ring-shaped magnets $R_{i-1}$ and $R_{i+1}$ on the shorter sides of the bar-shaped magnet $B_{i-1}$, provided that one shorter side of the bar-shaped magnet $B_{n-1}$ should not contact any other magnets. This arrangement enables a single closed curve to be drawn as shown in FIGS. 1A, 3, and 5A, where the curve is indicated by 40.

Figure 11:
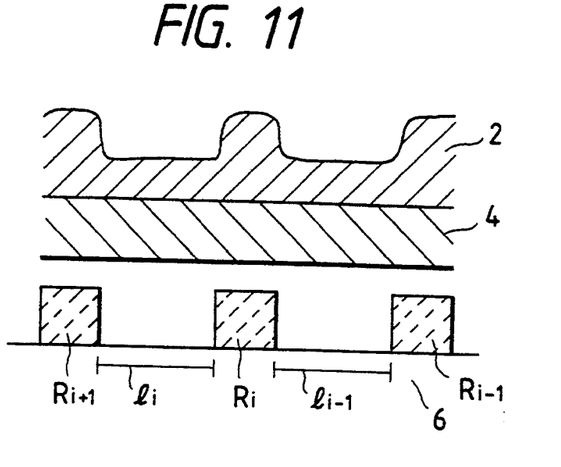
FIG. 11 shows the depth profile of erosion area on the surface of a target using complete annular magnets without providing bar-shaped magnets.

(ii) Any one of the midpoints of the width on the shorter side of the bar-shaped magnet $B_{i-1}$ is located on the midpoint $MP_i$ of the chord $C_i$ of the missing arc segment of the central circumference of the ring-shaped magnet $R_i$. For the same reason as described under (2)-(ii) in connection with the arrangement of ring-shaped magnets, various depth profiles of erosion can be easily produced across the target surface. Magnetic lines of force are created between the bar-shaped magnet $B_{i-1}$ and the ring-shaped magnet $R_i$ to generate magnetron discharge, whereby the surface of the target just above the ring-shaped magnet $R_i$ is also eroded. If the bar-shaped magnet $B_{i-1}$ is absent and if the ring-shaped magnet $R_i$ is a complete ring (which has no missing segment), a plasma, although unstable, will be generated by magnetron discharge. In this case, the target surface is eroded to result in a depth profile as shown in FIG. 11; in other words, the target surface just above the ring-shaped magnets is not eroded at all.

(iii) One shorter side of the bar-shaped magnet $B_{n-1}$ contacts the ring-shaped magnet $R_{n-1}$ and any one of the midpoints of the width on the shorter side of the bar-shaped magnet $B_{i-1}$ is located on the midpoint $MP_i$ of the chord $C_i$ of the missing arc segment of the central circumference of the ring-shaped magnet $R_i$ and, further, the distance between the central point O and the other shorter side of the bar-shaped magnet $B_{n-1}$ is smaller than the radius of the inner circle of the ring-shaped magnet $R_{n-1}$. That the distance between the central point O and the other shorter side of the bar-shaped magnet $B_{n-1}$ is smaller than the radius of the inner circumference of the ring-shaped magnet $R_{n-1}$ means that the longer side of the bar-shaped magnet $B_{n-1}$ does not extend over the central point O. To put this in another way, the ring-shaped magnets and the bar-shaped magnets are arranged in such a fashion that magnetic lines of force will be generated above the central point O. If the bar-shaped magnet $B_{n-1}$ per se lies, even partly, on the central point, the surface of the target corresponding to the central point O will not be eroded.

(4) Ring-shaped magnets $R_{i-1}$ and $R_{i+1}$ have surface poles of the same polarity as the surface pole of the bar-shaped magnet $B_{i-1}$, whereas the surface poles of the ring-shaped magnet $R_i$ and the bar-shaped magnet $B_i$ are opposite in polarity. This relationship of magnetic poles, as combined with the arrangement of ring-shaped magnets and bar-shaped magnets discussed under (3)-(i), insures that magnets of the same polarity are connected to each other.

In another preferred embodiment, the length on the longer sides of bar-shaped magnet $B_{n-1}$ is adjusted to be greater than the distance between the inner circumference of ring-shaped magnet $R_{n-1}$ and the inner circumference of ring-shaped magnet $R_n$. With this setting, the edge of the shorter side of the bar-shaped magnet $B_{n-1}$ will be located within the area defined by the inner circumference of the ring-shaped magnet $R_n$ and, as a result, the density of plasma produced above the area can be further increased.

As already mentioned in connection with the description of the prior art, given the coercive force of the magnets producing a magnetic field (magnetic lines of force) and also given the intensity of an electric field (electric lines of force) crossing the magnetic field (magnetic lines of force) at right angles, the density of the plasma generated by magnetron discharge will be in inverse proportion to the distance between two magnets. It is also generally known that the plasma density is in proportion to the rate of erosion. Therefore, one may well say that the distance between magnets is in inverse proportion to the rate of erosion. If one wants to increase the depth of erosion, he may do so by reducing the distance between magnets.

Figure 8A:
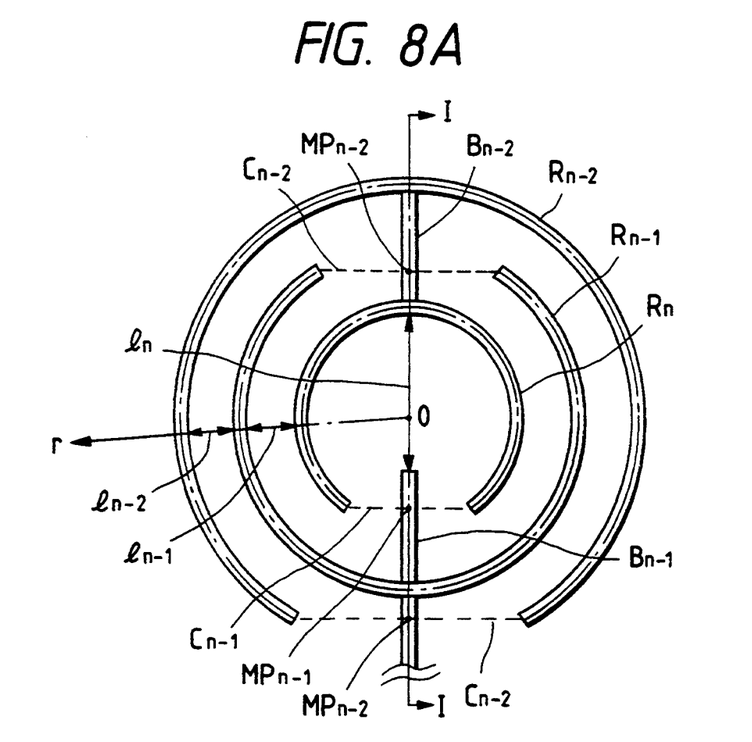
FIG. 8A shows a preferred embodiment of a generalized arrangement of the magnets in the central portion of the target.
Figure 8B:
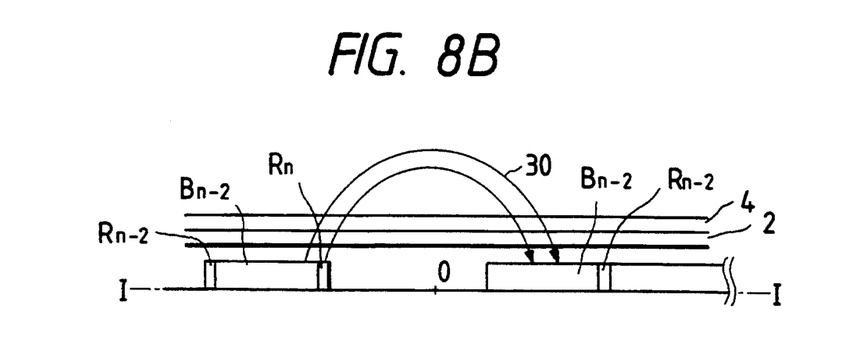
FIG. 8B is a section taken on line I—I in FIG. 8A which shows how magnetic lines of force are created above the central portion of the target.
Figure 10A:
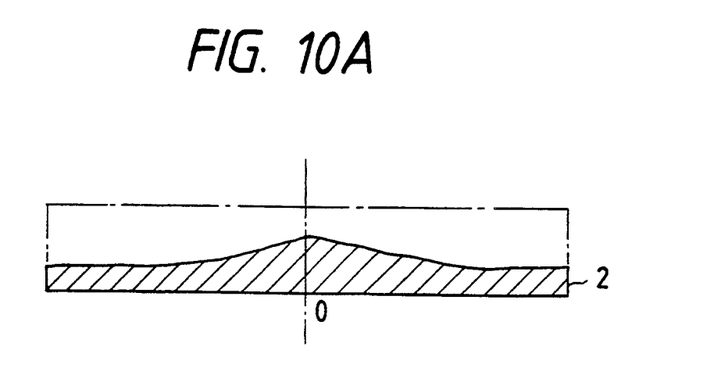
FIGS. 10A, 10B, and 10C show the depth profiles of erosion area on the surface of a target when it was sputtered with the distance between ring-like magnets being varied.

On the basis of this understanding, a desired depth profile of erosion can be produced across the target surface by adjusting the distance between ring-shaped magnets. For example, if one wants to produce the depth profile shown in FIG. 10A, he may set the distance between ring-shaped magnets to satisfy the following relationship:

$$l_1 < l_2 < l_3 < \ldots < l_{i-1} < l_i < l_{i+1} < \ldots < l_{n-1} < l_n$$

where $l_n$ is the distance between the ring-shaped magnet $R_n$ and the bar-shaped magnet $B_{n-1}$ which passes through the central point O (see FIG. 8A). The depth of erosion across the target just above the central point O is eventually determined by the flux density of magnetic lines of force 30 generated above the central point O (see FIG. 8B). In other words, $l_n$ may well be described as the longest distance between the bar-shaped magnet $B_{n-1}$ and the ring-shaped magnet $R_n$. The present inventors learned by experiments that in order to produce the depth profile of erosion shown in FIG. 10A, $l_n$ should preferably be about three fourths of the diameter of the inner circumference of ring-shaped magnet $R_n$.

Figure 10B:
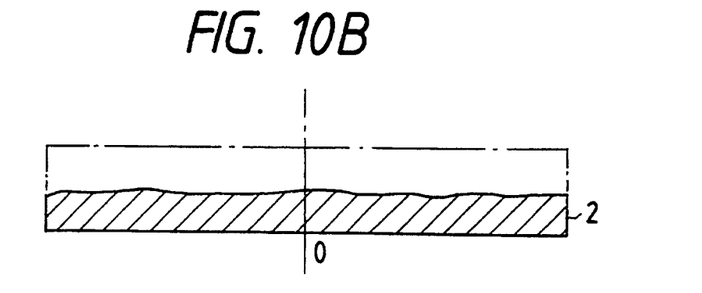

If one wants to erode uniformly across the target as shown in FIG. 10B, he may set the distance between ring-shaped magnets to satisfy the following relationship:

$$l_1 = l_2 = l_3 = \ldots = l_{i-1} = l_i = l_{i+1} = \ldots = l_{n-1} = l_n$$

Figure 10C:
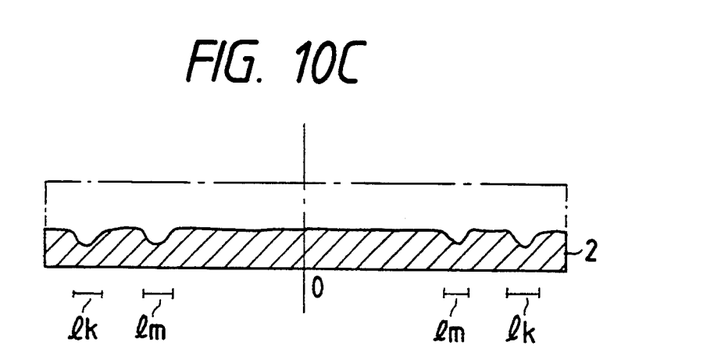

If one wants a depth profile of erosion in a manner that is deeper in specified areas than in others as shown in FIG. 10C, he may arrange ring-shaped magnets in such a way that the distances between magnets that correspond to those specified areas are smaller than the distance between any other magnets. In the case shown in FIG. 10C, the distances $l_k$ and $l_m$ which correspond to the two areas of deepest erosion are made smaller than the distances between any other magnets.

In yet another preferred embodiment, the widths of all ring-shaped magnets $R_1, R_2, R_3, \ldots, R_{i-1}, R_i, R_{i+1}, \ldots, R_{n-1}$ and $R_n$ are set to be equal to the widths on the shorter side of all bar-shaped magnets $B_1, B_2, B_3, \ldots, B_{i-1}, B_i, B_{i+1}, \ldots,$ and $B_{n-1}$. This offers the advantage of providing ease in designing a magnet arrangement that satisfies all of the conditions discussed herein.

FIG. 1A is a plan view showing the arrangement of magnets on the yoke of a magnetron cathode electrode assembly according to an embodiment of the present invention. The numerical data (in mm) of the individual magnets and their layout are also listed in FIG. 1A; numerals for the data on the individual magnets are $L1=10$, $L3=308$, $L4=185$, $L5=10$, $L6\pm10$, and $L8=87$, and numerals for the data on the layout of those magnets are $L2=44$ and $L7=20$.

Figure 1B:
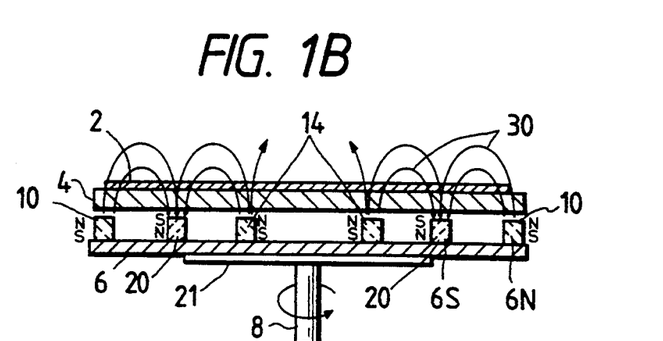
FIG. 1B is a front and sectional view as taken on line I—I in FIG. 1A.
Figure 1C:
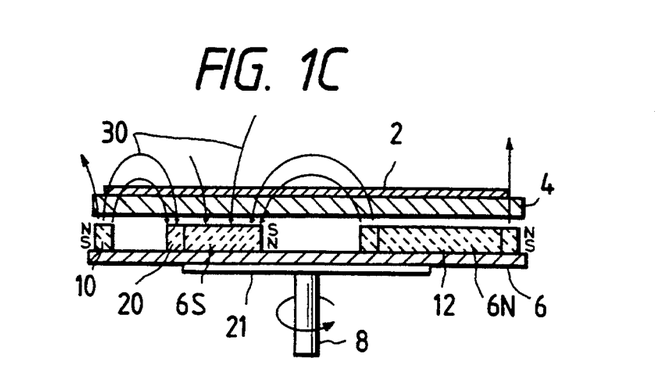
FIG. 1C is a side and sectional view as taken on line II—II in FIG. 1A.

FIG. 1B is a front and sectional view, as taken on line I—I in FIG. 1A, that shows the magnetic lines of force generated over the target. The vacuum chamber and the substrate are omitted from FIG. 1B. The components of the assembly shown in FIG. 1 are identified by numerals that are identical to those used in FIG. 4. FIG. 1C is a side and sectional view taken on line II—II in FIG. 1A.

As shown in FIGS. 1B and 1C, a permanent magnet unit 6N is arranged in the back side of the target 2, namely, on the yoke 6 provided in a face-to-face relationship with the back side of an electrode 4 carrying the target 2. This permanent magnet unit 6N has north (N) poles on the surface facing the target 2. The permanent magnet unit 6N is composed of an annular magnet 10 extending on the outer periphery of the electrode 4, a magnet 14 of a smaller diameter that surrounds the central portion 100 and which has a missing arc segment (this magnet is hereunder referred to as "incomplete annular magnet") and a bar-shaped magnet 12 that bridges the two magnets 10 and 14. A permanent magnet 6S is also mounted on the yoke 6 and it has south (S) poles on the surface facing the target 2. The permanent magnet unit 6S is composed of an incomplete annular magnet 20 (as located between the annular magnet 10 and the incomplete annular magnet 14) and a bar-shaped magnet 22 that extends from the middle of the magnet 20 toward the central portion of the target 2. The incomplete annular magnet 14 combines with the bar-shaped magnet 22 to surround the central portion 100; the two magnets are spaced from each other in a face-to-face relationship and the front end of the bar-shaped magnet 22 is spaced from the opposite ends of the incomplete annular magnet 14. If the target 2 is seen in a radial direction along one radius r, at least two N poles and one S pole are arranged alternately.

Dense magnetic lines of force 30 form closed loops above the target. If argon (Ar) gas is supplied into the vacuum chamber and a DC voltage applied between electrodes, electrons are generated that revolve spirally around the magnetic lines of force 30 and the plasma intensity becomes high, whereby the surface of the target 2 is sputtered to form a thin film of the target material deposited on the substrate 6.

Figure 2A:
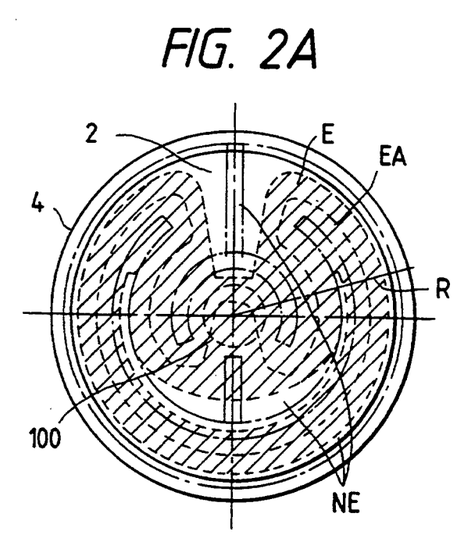
FIG. 2A shows the profile of the erosion area on the surface of a target when it was sputtered with the magnet arrangement shown in FIG. 1 without rotating the magnets.

FIG. 2A is a plan view showing the profile of erosion that occurred in the surface of target 2 by sputtering with the yoke 6 being held stationary (without being rotated). The hatched area EA refers to the eroded area, and the non-eroded area is indicated by NE. The eroded area EA covers the central portion 100. If one views the target 2 in a radial direction along one radius r, the eroded area is separated on that radius into two zones by the non-eroded area.

Figure 2B:
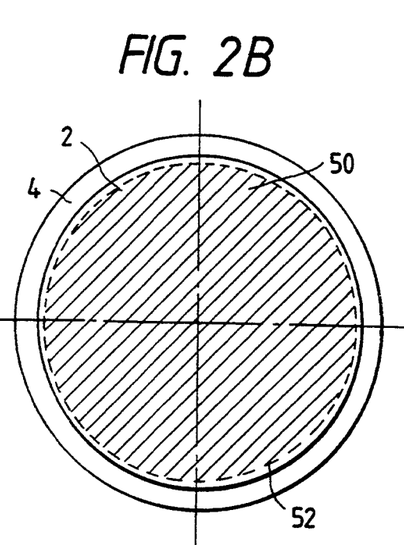
FIG. 2B shows the profile of the erosion area on the surface of a target when it was sputtered with the magnets being rotated.

FIG. 2B is a plan view showing an eroded area 50 and a non-eroded area 52 that occurred in the surface of target 2 by sputtering with the yoke 6 being rotated. The depth profile of this erosion which was produced by sputtering with the yoke being rotated is delineated by the thick dashed line in FIG. 4C (the target is shown exaggerated in the direction of its thickness). Unlike in the case of the prior art, the central portion 100 of the target 2 can be sputtered to a sufficient degree to insure that the central portion will not be a cause of particulate contamination.

FIG. 3 is a front view showing the arrangement of magnets in a magnetron sputtering apparatus according to another embodiment of the present invention. The arrangement of magnets in this embodiment is useful for the case where a target of larger diameter is required and it differs from the arrangement shown in FIG. 1A in the following points: an annular magnet 24 is provided in the outermost position, and the annular magnet 10 shown in FIG. 1A is replaced by an incomplete annular magnet 26, and another bar-like magnet 28 is provided. The resulting arrangement is such that two N poles alternate with two S poles on one radius r on the target. Hence, the eroded area is separated into two zones by the non-eroded area on the radius r. If the diameter of the target is further increased, one may increase the number of alternating N and S poles, so that the eroded area is separated into a corresponding number of zones by the non-eroded area on the radius r.

According to another aspect of the present invention, a single magnet having poles on lateral sides may be cut out under the conditions described below and the magnet setup thus produced provides the same technical advantages as those attained by the magnet arrangement described above. The conditions are as follows:

(1) the single magnet is cut out to form a plurality of portions that surround the center of the target;

(2) regions over which the magnetic lines of force that are created by both the magnetic pole on the lateral side of a cut portion and the magnetic pole on the lateral side of another cut portion that neighbors the first mentioned cut portion in a non-linking manner are arranged in such a way as to draw a single closed curve; and (3) magnetic lines of force are created above the central point of the target.

To state a specific way that can advantageously meet these conditions, a single circular magnet having poles on lateral sides should be cut to form n ring-shaped vacant portions $R_1, R_2, R_3, \ldots, R_{i-1}, R_i, R_{i+1}, \ldots, R_{n-1}$ and $R_n$, and (n−1) bar-shaped vacant portions $B_1, B_2, B_3, \ldots, B_{i-1}, B_i, B_{i+1}, \ldots$ and $B_{n-1}$, being further characterized in that:

(1) the ring-shaped vacant portions satisfy the following conditions:
  (i) the outer circumference of the ring-shaped vacant portion $R_i$ is smaller than the inner circumference of the ring-shaped vacant portion $R_{i-1}$;
  (ii) Ring-shaped vacant portions $R_2, R_3, \ldots, R_{i-1}, R_i, R_{i+1}, \ldots, R_{n-1}$ and $R_n$ each have a missing arc segment;
  (iii) the central angle $\theta_i$ subtended by the missing arc segment of the central circumference of the ring-shaped vacant portion $R_i$ is smaller than 180° and the chord $IC_i$ of the missing arc segment of the inner circumference of the ring-shaped vacant portion $R_i$ is greater than the width on the shorter side of the bar-shaped vacant portion $B_{i-1}$;

(2) the arrangement of the ring-shaped vacant portions satisfies the following conditions:
  (i) Ring-shaped vacant portions $R_2, R_3, \ldots, R_{i-1}, R_i, R_{i+1}, \ldots, R_{n-1}$ and $R_n$ are formed by cutting out in such a way that they are arranged concentrically with the central point O of the ring-shaped vacant portion $R_1$, which is located to coincide with the central point of the rotary driving means for driving those ring-shaped vacant portions;
  (ii) Ring-shaped vacant portions $R_3, \ldots, R_{i-1}, R_i, R_{i+1}, \ldots, R_{n-1}$ and $R_n$ have such a positional relationship that the midpoints $MP_3, \ldots, MP_{i-1}, MP_i, MP_{i+1}, \ldots, MP_{n-1}$ and $MP_n$ of the chords $C_3, \ldots, C_{i-1}, C_i, C_{i+1}, \ldots, C_{n-1}$ and $C_n$, respectively, of them missing arc segments of the respective central circumferences are located on the line passing through the central point O and the midpoint $MP_2$ of the chord $C_2$ of the missing arc segment of the central circumference of the ring-shaped vacant portion $R_2$, wherein:

(3) the relative positions of the ring-shaped vacant portions and the bar-shaped vacant portions satisfy the following conditions:
  (i) Bar-shaped vacant portion $B_{i-1}$ are connected to the ring-shaped vacant portions $R_{i-1}$ and $R_{i+1}$ on the shorter sides of the bar-shaped vacant portion $B_{i-1}$;
  (ii) any one of the midpoints of the width on the shorter side of the bar-shaped vacant portion $B_{i-1}$ is located on the midpoint $MP_i$ of the missing arc segment of the central circumference of the ring-shaped vacant portion $R_i$;
  (iii) one shorter side of the bar-shaped vacant portion $B_{n-1}$ is connected to the ring-shaped vacant portion $R_{n-1}$ and any one of the midpoints of the width on the shorter side of the bar-shaped vacant portion $B_{i-1}$ is located on the midpoint $MP_i$ of the missing arc segment of the central circumference of the ring-shaped vacant portion $R_i$ and the distance between the central point O and the other shorter side of the bar-shaped vacant portion $B_{n-1}$ is smaller than the radius of the inner circumference of the ring-shaped vacant portion $R_{n-1}$; and (4) Ring-shaped vacant portions $R_{i-1}$ and $R_{i+1}$ have lateral poles of the same polarity as the lateral pole of the bar-shaped vacant portion $B_{i-1}$ whereas the lateral poles of the ring-shaped vacant portion $R_i$ and the bar-shaped vacant portion $B_i$ are opposite in polarity.

Figure 5B:
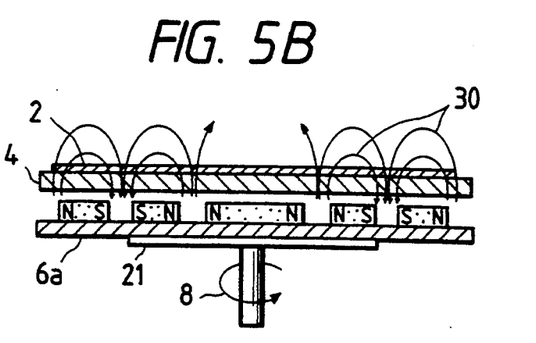
FIG. 5B is a front sectional view as taken on line I—I in FIG. 5A.
Figure 5C:
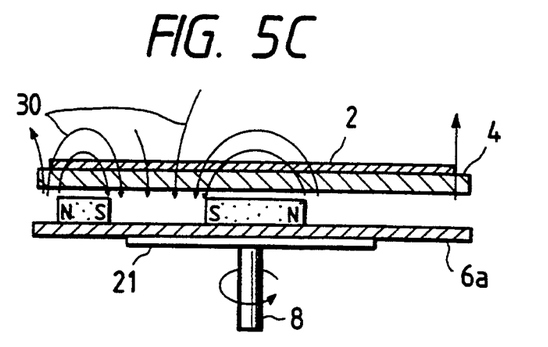
FIG. 5C is a side and sectional view as taken on line II—II in FIG. 5A.

FIG. 5A is a plan view of a magnet 200 that has been cut out under the conditions set forth above and which is provided on a non-magnetic support 6a. FIG. 5B is a front and sectional view, as taken on line I—I in FIG. 5A, that shows the electric field and magnetic lines of force above the target in a magnetron sputtering apparatus. The vacuum chamber and the substrate are omitted from FIG. 5B. The components of the apparatus shown in FIG. 5 are identified by numerals that are identical to those used in FIG. 1. FIG. 5C is a side and sectional view taken on line II—II in FIG. 5A. The magnets shown in FIG. 1 are disposed in such a way that N/S pole pairs stand vertically on the yoke whereas the magnets shown in FIG. 5 are disposed in such a way that N/S pole pairs lie parallel to the surface of the yoke. Compared to the magnet arrangement shown in FIG. 1A, the embodiment shown in FIG. 5 is characterized in that the order of arrangement of magnet portions and blank portions is reversed. The magnetic lines of force extending above the target tend to be somewhat weaker than those created in the case of FIG. 1.

The objectives of the present invention may effectively be achieved if magnets are arranged in such a-way that at least the central portion of the target is surrounded by different magnetic poles that face each other at a certain spacing. The arrangement of magnetic poles that lie outside those central poles may be selected as appropriate for the specific design to be adopted.

According to the present invention, the target can be sufficiently sputtered in the central portion to insure that it will not be a source of contamination by particles. The invention also provides a magnetron sputtering apparatus equipped with a magnetron cathode assembly that permits the use of a target of larger diameter and which yet is capable of reducing the distance between magnets sufficiently to accomplish sputtering at a satisfactorily high speed.

What is claimed is:

1. A magnetron cathode assembly comprising:
a flat circular target;
a magnetic field application means provided near the back side of the target; and
a rotation drive means for rotating said magnetic field application means with respect to a center of said circular target;
wherein said magnetic field application means includes a plurality of first annular magnets having a first polarity and a plurality of second annular magnets having a second polarity which is opposite said first polarity; the radii of said first and second annular magnets being sequentially changed, each of said first and second annular magnets, except for an outermost circumferential annular magnet, missing an arc segment; said first and second annular magnets are alternately arranged concentrically with the center of the circular target;
wherein neighboring annular magnets which have the same polarity are connected to each other through the missing arc segment of the annular magnet having opposite polarity by a bar-shaped magnet which has the same polarity as the annular magnets;
and wherein, extending from the inner circumference, said bar-shaped magnet is inserted into the missing arc segment of said innermost annular magnet to create magnetic lines of force above the center of the target.

2. A magnetron cathode assembly comprising:
a flat circular target;
a magnetic field application means provided near the back side of said target; and
a rotary driving means for rotating said magnetic field application means;
wherein said magnetic field application means has a plurality of magnets, one of which is a loop-shaped magnet, said plurality of magnets being arranged in such a way as to satisfy the following conditions:
said magnets are alternately arranged in a way such that they surround the center of said target;
said loop-shaped magnet is located in the outermost position;
and two neighboring magnets that do not contact each other have opposite polarities and any two magnets that contact each other have the same polarity;
regions containing the magnetic lines of force that are created by any two neighboring magnets that do not contact each other are arranged in such a way as to define a single closed curve; and
magnetic lines of force are created above the center of the target.

3. A magnetron cathode assembly according to claim 2 wherein said plurality of magnets include a curvilinear magnet and a bar-shaped magnet.

4. A magnetron cathode assembly according to claim 2 wherein at least one of the magnets in said magnetic field application means contacts a magnet with a pole of the same polarity.

5. A magnetron cathode assembly comprising:
a flat circular target;
a magnetic field application means provided near the back side of said target; and
a rotary driving means for rotating said magnetic field application means;
wherein said magnetic field application means includes n ring-shaped magnets $R_1, R_2, R_3, \ldots, R_{i-1}, R_i, R_{i+1}, \ldots, R_{n-1}$ and $R_n$, and (n−1) bar-shaped magnets $B_1, B_2, B_3, \ldots, B_{i-1}, B_i, B_{i+1}, \ldots,$ and $B_{n-1}$;
wherein said ring-shaped magnets satisfy the following conditions:
the outer circumference of the ring-shaped magnet $R_1$ should be smaller than the inner circumference of the ring-shaped magnet $R_{i-1}$;
each of aid ring-shaped magnets $R_2, R_3, \ldots, R_{i-1}, R_i, R_{i+1}, \ldots, R_{n-1}$ and $R_n$ have an arc segment missing;
the central angle $\theta_i$ subtended by the missing arc segment of the central circumference of the ring-shaped magnet $R_i$ is smaller than 180° and the chord $C_i$ of the missing arc segment of the inner circumference of the ring-shaped magnet $R_i$ is greater than the width on the shorter side of the bar-shaped magnet $B_{i-1}$;
wherein the arrangement of said ring-shaped magnets satisfies the following conditions:
said ring-shaped magnets $R_2, R_3 \ldots, R_{i-1}, R_i, R_{i+1}, \ldots, R_{n-1}$ and $R_n$ are arranged concentrically with the central point O of the ring-shaped magnet $R_1$, which is located to coincide with the central axis of the rotary driving means for rotating those ring-shaped magnets;
said ring-shaped magnets $R_3, \ldots, R_{i-1}, R_i, R_{i+1}, \ldots, R_{n-1}$ and $R_n$ have such a positional relationship that the midpoints $MP_3, \ldots, MP_{i-1}, MP_i, MP_{i+1}, \ldots, MP_{n-1}$ and $MP_n$ of the chords $C_3, \ldots, C_{i-1}, C_i, C_{i+1}, \ldots, C_{n-1}$ and $C_n$, respectively, of the missing arc segments of the respective central circumferences are located on the line connecting the central point O and the midpoint $MP_2$ of the chord $C_2$ of the missing arc segment of the central circumference of the ring-shaped magnet $R_2$;
wherein the relative positions of the ring-shaped magnets and the bar-shaped magnets satisfy the following conditions:
bar-shaped magnet $B_{i-1}$ contacts the ring-shaped magnets $R_{i-1}$ and $R_{i+1}$ on the shorter sides of the bar-shaped magnet $B_{i-1}$;
each of the midpoints of the width on the shorter side of the bar-shaped magnet $B_{i-1}$ is located on the midpoint $MP_i$ of the chord $C_i$ of the missing arc segment of the central circumference of the ring-shaped magnet $R_i$; and one shorter side of the bar-shaped magnet $B_{n-1}$ contacts the ring-shaped magnet $R_{n-1}$ and each of the midpoints of the width on the shorter side of the bar-shaped magnet $B_{i-1}$ is located on the midpoint $MP_i$ of the chord $C_i$ of the missing arc segment of the central circumference of the ring-shaped magnet $R_i$ and the distance between the central point O and the other shorter side of the [bar-like-bar-shaped magnet $B_{n-1}$ is smaller than the radius of the inner circumference of the ring-shaped magnet $R_{n-1}$; and wherein said ring-shaped magnets $R_{i-1}$ and $R_{i+1}$ have surface poles of the same polarity as the surface pole of the bar-shaped magnet $B_{i-1}$ whereas the surface poles of the ring-shaped magnet $R_i$ and the bar-shaped magnet $B_i$ are opposite in polarity.

6. A magnetron cathode assembly according to claim 5 wherein the length on the longer sides of said bar-shaped magnet $B_{n-1}$ in said magnetic field application means is adjusted to be greater than the distance between the inner circumference of said ring-shaped magnet $R_{n-1}$ and the inner circumference of said ring-shaped magnet $R_n$.

7. A magnetron cathode assembly according to claim 5 wherein the distance $Cl_i$ between said ring-shaped magnet $R_i$ and said ring-shaped magnet $B_{i-1}$ is equal to the distance $l_i$ between the inner circumference of the said ring-shaped magnet $R_i$ and the outer circumference of said ring-shaped magnet $R_{i+1}$.

8. A magnetron cathode assembly according to claim 5 wherein said magnetic field application means is set to satisfy the following relationship:

$$l_1 < l_2 < l_3 < \ldots < l_{i-1} < l_i < l_{i+1} < \ldots < l_{n-1} < l_n$$

wherein $l_i$ is the distance between the inner circumference of said ring-shaped magnet $R_i$ and the outer circumference of said ring-shaped magnet $R_{i+1}$, and $l_n$ is the distance between the ring-shaped magnet $R_n$ and the bar-shaped magnet $B_{n-1}$ which passes through the central point O.

9. A magnetron cathode assembly according to claim 8 wherein said distance $l_n$ is set to be about three fourths of the diameter of the inner circumference of said ring-shaped magnet $R_n$.

10. A magnetron cathode assembly according to claim 5 wherein said magnetic field application means is set to satisfy the following relationship:

$$l_1 = l_2 = l_3 = \ldots = l_{i-1} = l_i = l_{i+1} = \ldots = l_{n-1} = l_n$$

where $l_i$ is the distance between the inner circumference of said ring-shaped magnet $R_i$ and the outer circumference of said ring-shaped magnet $R_{i+1}$, and $l_n$ is the distance between the ring-shaped magnet $R_n$ and the bar-shaped magnet $B_{n-1}$ which passes through the central point O.

11. A magnetron cathode assembly according to claim 5 wherein said magnetic field application means is such that distances $l_k$ and $l_m$ are shorter than any other distances, with $l_i$ being the distance between the inner circumference of said ring-like magnet $R_i$ and the outer circumference of said ring-like magnet $R_{i+1}$, and $l_n$ is the distance between the ring-shaped magnet $R_n$ and the bar-shaped magnet $B_{n-1}$ which passes through the central point O.

12. A magnetron cathode assembly according to claim 5 wherein said magnetic field application means is such that the widths of all ring-shaped magnets $R_i$, $R_2$, $R_3 \ldots$, $R_{i-1}$, $R_i$, $R_{i-1}$, $\ldots$, $R_{n-1}$ and $R_n$ are set to be equal to the widths on the shorter side of all bar-shaped magnets $B_1$, $B_2$, $B_3$, $\ldots$, $B_{i-1}$, $B_i$, $B_{i+1}$ and $B_{n-1}$.

13. A magnetron cathode assembly comprising:
a flat circular target;
a magnetic field application means provided near the back side of said target; and
a rotary driving means for rotating said magnetic field application means;
wherein said magnetic field application means comprises a single magnet having poles on lateral sides, said single magnet being formed by cutting out portions thereof under the following conditions:
said single magnet is cut out to form a plurality of portions that surround the center of the target;
regions under the magnetic lines of force that are created by both the magnetic pole on the lateral side of a cut out portion and the magnetic pole on the lateral side of another cut out portion that neighbors the first mentioned cut out portion in a non-linking manner are arranged in such a way as to define a single closed curve; and
magnetic lines of force are created above the center of the target.

14. A magnetron cathode assembly comprising:
a flat circular target;
a magnetic field application means provided near the back side of said target; and
a rotational drive means for rotating said magnetic field application means;
wherein said magnetic field application means comprises a single circular magnet having poles on lateral sides, said circular magnet being cut out or shaped so as to form n ring-shaped vacant portions $R_1$, $R_2$, $R_3$, $\ldots$, $R_{i-1}$, $R_i$, $R_{i+1}$, $\ldots$, $R_{n-1}$ and $R_n$, and (n-1) bar-shaped vacant portions $B_1$, $B_2$, $B_3$, $\ldots$, $B_{i-1}$, $B_i$, $B_{i+1}$, $\ldots$ and $B_{n-1}$,
wherein said ring,shaped vacant portions satisfy the following conditions:
the outer circumference of the ring-shaped vacant portion $R_i$ is smaller than the inner circumference of the ring-shaped vacant portion $R_{i-1}$;
each of said ring-shaped vacant portions $R_2$, $R_3$, $\ldots$, $R_{i-1}$, $R_i$, $R_{i+1}$, $\ldots$, $R_{n-1}$ and $R_n$ has a missing arc segment;
the central angle $\theta_i$ subtended by the missing arc segment of the central circumference of the ring-shaped vacant portion $R_i$ is smaller than 180° and the chord $C_i$ of the missing arc segment or the inner circumference of the ring-shaped vacant portion $R_i$ is greater than the width on the shorter side of the bar-shaped vacant portion $B_{i-1}$;
wherein the arrangement of said ring-shaped vacant portions satisfies the following conditions:
said ring-shaped vacant portions $R_2$, $R_3$, $\ldots$, $R_{i-1}$, $R_i$, $R_{i+1}$, $\ldots$, $R_{n-1}$ and $R_n$ are formed by cutting out the magnet in such a way that they are arranged concentrically with the center 0 of the ring-shaped vacant portion $R_1$ being located to coincide with the central point of the rotary driving means for driving those ring-shaped vacant portions;
said ring-shaped vacant portions $R_3$, $\ldots$, $R_{i-1}$, $R_i$, $R_{i+1}$, $\ldots$, $R_{n-1}$ and $R_n$ have such a positional relationship that the midpoints $MP_3, \ldots, MP_{i-1}$, $MP_i, MP_{i+1}, \ldots, MP_{n-1}$ and $MP_n$ of the chords $C_3, \ldots, C_{i-1}, C_i, C_{i+1}, \ldots, C_{n-1}$ and $C_n$, respectively, of the missing arc segments of the respective central circumference is located on the line connecting the central point O and the midpoint $MP_2$ of the chord $C_2$ of the missing arc segment of the central circumference of the ring-like vacant portion $R_2$;

wherein the relative positions of the ring-shaped vacant portions and the bar-shaped vacant portions satisfy the following conditions:

said bar-shaped vacant portion $B_{i-1}$ is connected to the ring-shaped vacant portions $R_{i-1}$ and $R_{i+1}$ on the shorter sides of the bar-shaped vacant portion $B_{i-1}$;

each of the midpoints of the width on the shorter side of the bar-shaped vacant portion $B_{i-1}$ is located on the midpoint $MP_i$ of the missing arc segment of the central circumference of the ring-shaped vacant portion $R_i$;

one shorter side of the bar-shaped vacant portion $B_{n-1}$ is connected to the ring-shaped vacant portion $R_{n-1}$, and each of the midpoints of the width on the shorter side of the bar-shaped vacant portion $B_{i-1}$ is located on the midpoint $MP_i$ of the missing arc segment of the central circle of the ring-shaped vacant portion $R_i$, and the distance between the central point O and the other shorter side of the bar-shaped vacant portion $B_{n-}$ is smaller than the radius of the inner circumference of the ring-shaped vacant portion $R_{n-1}$; and wherein said ring-shaped vacant portions $R_{i-1}$ and $R_{i+1}$ have lateral poles of the same polarity as the lateral pole of the bar-shaped vacant portion $B_{i-1}$ whereas the lateral poles of the ring-shaped vacant portion $R_i$ and the bar-shaped vacant portion $B_i$ are opposite in polarity.

* * * * *